(12) United States Patent
Previtali

(10) Patent No.: US 7,977,195 B2
(45) Date of Patent: Jul. 12, 2011

(54) METHOD FOR MANUFACTURING A FIELD EFFECT TRANSISTOR WITH AUTO-ALIGNED GRIDS

(75) Inventor: Bernard Previtali, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 590 days.

(21) Appl. No.: 12/043,539

(22) Filed: Mar. 6, 2008

(65) Prior Publication Data
US 2008/0220569 A1    Sep. 11, 2008

(30) Foreign Application Priority Data

Mar. 9, 2007   (FR) ...................................... 07 53740

(51) Int. Cl.
*H01L 21/336*    (2006.01)
(52) U.S. Cl. . 438/283; 438/157; 438/176; 257/E21.637; 257/E21.64
(58) Field of Classification Search ................... 438/283, 438/157, 176, 279; 483/195; 257/E21.637, 257/E21.64
See application file for complete search history.

(56) References Cited

U.S. PATENT DOCUMENTS

| | | | |
|---|---|---|---|
| 5,583,362 A | 12/1996 | Maegawa | |
| 5,773,331 A | 6/1998 | Solomon et al. | |
| 7,022,562 B2 | 4/2006 | Deleonibus | |
| 7,473,967 B2 * | 1/2009 | Sorada et al. | 257/347 |
| 2005/0282318 A1 | 12/2005 | Dao | |
| 2006/0027881 A1 * | 2/2006 | Ilicali et al. | 257/401 |
| 2006/0270164 A1 * | 11/2006 | Li et al. | 438/283 |
| 2010/0264492 A1 * | 10/2010 | Surdeanu et al. | 257/348 |

FOREIGN PATENT DOCUMENTS

DE    199 28 564 A1    1/2001
EP    1 188 188 B1    8/2005

OTHER PUBLICATIONS

F. Allibert, et al., "Characterization of Ultra-Thin SOI Films for Double-Gate MOSFET's", IEEE International SOI Conference, Oct. 2002, pp. 187-188.

* cited by examiner

*Primary Examiner* — Asok K Sarkar
*Assistant Examiner* — Julia Slutsker
(74) *Attorney, Agent, or Firm* — Oblon, Spivak, McClelland, Maier & Neustadt, L.L.P.

(57) ABSTRACT

A method for manufacturing at least one structure for a double grid field effect transistor, including: forming, on an isolating face of a first substrate, a stack comprising successively at least one layer of rear grid material, a layer of rear grid isolator, one semi-conducting zone for each structure to be manufactured, an electrically insulating layer of a front grid, at least one layer of front grid material and a masking element for each structure to be manufactured, placed facing the semi-conducting zone; forming in the at least one layer of front grid material a pattern reproducing a shape of the masking element and comprising etching of the layer of front grid material to eliminate the front grid material outside the pattern; and forming on free faces of the pattern a sacrificial spacer covering a first part of the semi-conducting zone.

8 Claims, 12 Drawing Sheets

METHOD FOR MANUFACTURING A FIELD EFFECT TRANSISTOR WITH AUTO-ALIGNED GRIDS

TECHNICAL FIELD

The invention relates to a method for manufacturing a field effect transistor with double grids, the grids being auto-aligned and horizontal.

STATE OF THE PRIOR ART

The document FR-A-2 829 294 (corresponding to U.S. Pat. No. 7,022,562) discloses a field effect transistor with horizontal auto-aligned grids and its method of manufacture. This transistor comprises an active region forming a channel, a first isolated grid associated with a first side of the active region, source and drain regions shaped in a part of the active region, on the other side of the channel and auto-aligned on the first grid, a second isolated grid associated with a second side of the active region, opposite the first side of the active region.

The method for producing this transistor comprises the following steps:
  formation of a stack of layers comprising, starting from a supporting substrate: a first grid layer, a grid isolating layer, an active layer, a second grid isolating layer and a second grid layer,
  defining of a grid, termed upper grid, in the second grid layer,
  formation in the active layer of source and drain regions auto-aligned on the upper grid, and
  formation of a grid, termed lower, placed between the supporting substrate and the active layer, the lower grid being shaped such that it is auto-aligned on the upper grid.

The upper grid masks the production of the channel and of the lower grid, a set of multiple spacers protecting the upper grid during the etching of the channel (first spacer), the channel during the etching of the lower grid (second spacer) and to isolate the lower grid from the source and drain regions (third spacer).

This method of production has a number of disadvantages. The grid and its protections (hard mask and spacers) are subjected to multiple etchings. Access to the channel requires extraction of the second spacer selectively relative to the first and third spacers. This approach imposes source and drain regions which are not in crystalline silicon. Usually, source and drain regions are metallic. They are obtained by the formation and filling of an isolating gap by a metal. Stacking of the grids separates the source from the drain by mechanical polishing.

The document US 2006/0022264 discloses a method for manufacturing a semiconductor device with a double grid, the grids being auto-aligned. The method for manufacturing this transistor includes the use of a first grid (or front grid) and its spacers as an etching mask for the channel and for a layer of epitaxial SiGe on a massive Si or Ge substrate. After bonding and turning, a front grid of the damascene type is produced.

The document US 2006/0027881 discloses a method for manufacturing a double grid field effect transistor, in which the front grid and an epitaxy of the source and drain type are used to form, under the channel and the grid, a zone eliminated after bonding and turning in order to house the front grid.

Both of the above documents (US 2006/0022264 and US 2006/0027881) disclose methods which have the disadvantage of using the channel as a layer to stop the etching of the internal spacers, although the channel is a zone sensitive to any pollution. Another disadvantage inherent to these methods is that the capacitances present between the front grid and the source and between the front grid and the drain can impair the functioning of the device obtained.

EXPLANATION OF THE INVENTION

To remedy the disadvantages of the prior art, this invention proposes a method for etching only the necessary part of the field effect transistor and to form the rear grid while maintaining the source and drain zones in a monocrystalline semiconductor material.

The object of the invention is therefore a method for manufacturing at least one structure for a double grid field effect transistor, comprising steps consisting of:
  forming, on an isolating face of a first substrate, a stack comprising successively at least one layer of rear grid material, an electrically insulating layer of the rear grid, a semi-conducting zone for each structure to be manufactured, a layer of one electrically insulating layer of the front grid, at least one layer of front grid material and a masking element for each structure to be manufactured, arranged with regard to the semi-conducting zone,
  forming in the layer of front grid material a pattern reproducing the shape of the masking element and comprising the etching of the layer of front grid material so as to eliminate the front grid material outside said pattern,
  forming on the free faces of the pattern a sacrificial spacer covering a first part of the semi-conducting zone and eliminating the exposed part of the electrically insulating layer of the front grid, in this manner revealing the remaining part, or second part, of the semi-conducting zone, intended to constitute the source and drain regions of the transistor,
  forming a protective layer over the remaining part, or second part, of the semi-conducting zone,
  eliminating the sacrificial spacer covering said first part of the semi-conducting zone,
  etching the first part of the semi-conducting zone, which is no longer covered by the sacrificial spacer, to delineate the channel of the transistor.

The step of forming the stack can comprise steps consisting of:
  choosing a second substrate of the semiconductor type on an isolator, in other words a substrate comprising a support supporting successively an electrically insulating layer and a semi-conducting layer intended to provide said semi-conducting zone,
  forming, on said semi-conducting layer, said electrically insulating layer of the rear grid and said at least one layer of rear grid material,
  fixing the second substrate on the first substrate, said layers formed on the second substrate facing an electrically insulating face of the first substrate,
  eliminating the support and the electrically insulating layer for the second substrate to reveal the semi-conducting layer,
  etching the semi-conducting layer to obtain said semi-conducting zone and reveal the electrically insulating layer of the rear grid,
  forming successively on said semi-conducting zone and the electrically insulating layer of the rear grid revealed with the step on etching an electrically insulating layer of the front grid, at least one layer of front grid material and a masking layer,
  etching the masking layer to obtain said masking element.

In this case, an electrically insulating layer can also be formed on said at least one layer of rear grid material to act as a bonding layer, at the time of fixing the second substrate on the first substrate, with the electrically insulating face of the first substrate which is a free face of an electrically insulating layer for the first substrate and also forming a bonding layer.

According to a first embodiment, the step consisting of forming a pattern in the layer of front grid material comprises a step of anisotropic etching in order to eliminate the front grid material outside the pattern, a step of isotropic etching in order to reduce the length of the front grid and form housings for the front grid spacers under the masking element, and a step to form the front grid spacers in said housings. The front grid spacers can then be formed by depositing a layer of front grid spacer material and by anisotropic etching of the layer of front grid spacer material.

The method can then also comprise steps consisting of:
etching the electrically insulating layer of the rear grid exposed after etching the first part of the semi-conducting zone,
eliminating said protective layer,
etching said at least one layer of rear grid material not masked by the unetched parts of the electrically insulating layer of the rear grid, until said isolating face of the first substrate is reached,
reducing, by means of isotropic etching, the length of the existing parts of said at least one layer of rear grid material, in this manner forming housings for the rear grid spacers,
forming the rear grid spacers in said rear grid spacer housings,
epitaxial layering, starting with the remaining part, or second part, of the semi-conducting zone, of zones for connection to the channel of the transistor so as to constitute the source and drain regions.

According to a second embodiment, the step consisting of forming a pattern in the layer of front grid material comprises a step of anisotropic etching in order to eliminate the front grid material outside the pattern.

The method can then also comprise steps consisting of:
etching the electrically insulating layer of the rear grid exposed after etching the first part of the semi-conducting zone,
eliminating said protective layer,
etching said at least one layer of rear grid material not masked by the unetched parts of the electrically insulating layer of the rear grid, until said isolating face of the first substrate is reached,
reducing, by means of isotropic etching, the length of the existing parts of said at least one layer of front grid material and said at least one layer of rear grid material, in this manner forming housings for the front grid spacers and housings for the rear grid spacers,
forming the front grid spacers in the housings for the front grid spacers and the rear grid spacers in the housings for the rear grid spacers,
epitaxial layering, starting with the remaining part, or second part, of the semi-conducting zone, of zones for connection to the channel of the transistor so as to constitute the source and drain regions.

BRIEF DESCRIPTION OF THE DRAWINGS

The invention will be best understood and other advantages and features will become apparent on reading the description which follows, given as an example, but not limiting in any way, accompanied by the appended drawings, among which.

DETAILED EXPLANATION OF PARTICULAR EMBODIMENTS

FIGS. 1A to 1E illustrate the preparatory steps of a method for manufacturing a field effect transistor with auto-aligned grids according to the invention. The method can then be continued according to a first variant illustrated by FIGS. 2A to 2J or according to a second variant illustrated by FIGS. 3A to 3I.

Figure 1A:
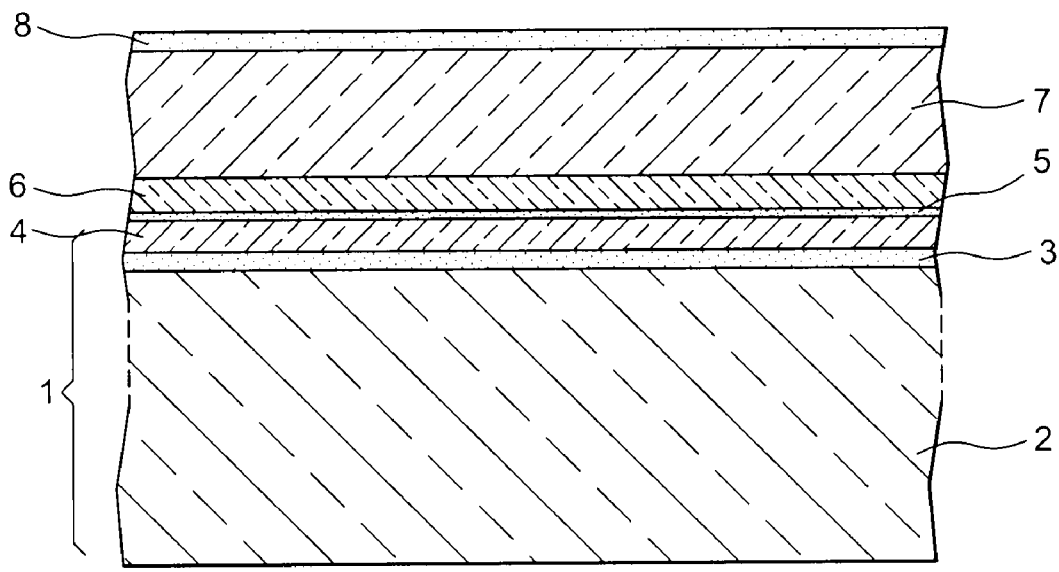
FIGS. 1A to 1E illustrate the preparatory steps of a method for manufacturing a field effect transistor with auto-aligned grids according to the invention.

FIG. 1A shows a semiconductor substrate of the semiconductor-on-isolator type 1, for example a substrate SOI comprising a silicon support 2 supporting a layer 3 of silicon oxide and a layer 4 of silicon. This substrate could also be chosen from SSOI (Stressed Silicon on Isolator) and GeOI substrates, with an isolator which can be $SiO_2$ or silicon nitride. On the layer 4 of silicon is deposited successively an isolating layer 5, a first layer 6 of rear grid material, a second layer 7 of rear grid material and a bonding layer 8, for example in silicon oxide.

If the layer 4 is in silicon, the isolating layer 5 is advantageously in silicon oxide. It provides the rear grid isolator. The rear grid materials are selected for their etching chemistry, differing from that of the active zone material. In the case of active zones in silicon (supplied by the layer 4), the material of the layer 6 can be in TiN and that of the layer 7 in SiGe or in polysilicon doped to obtain satisfactory selectivity relative to silicon. SiGe or polysilicon are, in this example of an embodiment, only used to place the grid under a voltage (shunt role), the true grid material being TiN. The rear grid material (material for the layer 6) can also be $W_y Si_x$ or TiNSi alloy or even TaN.

Figure 1B:
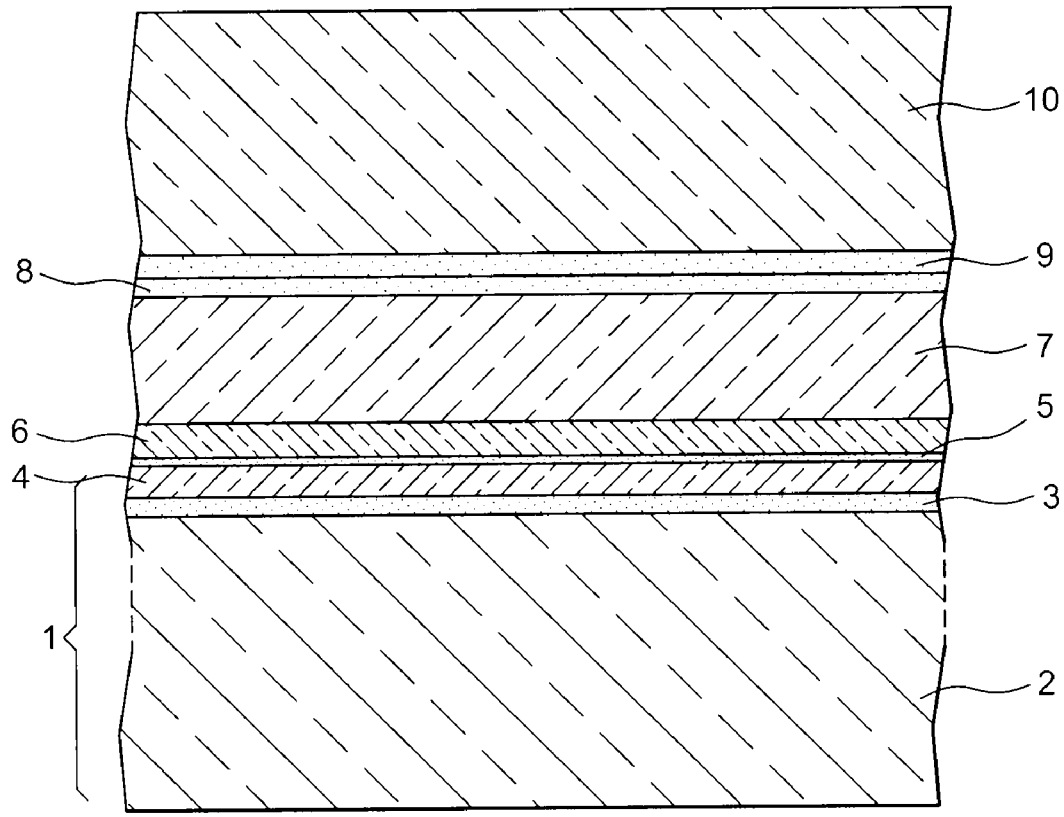

The structure represented in FIG. 1A is transferred and bonded on to a massive substrate. This massive substrate is, for example, silicon oxide on the surface. FIG. 1B shows the structure obtained previously, bonded to the massive substrate 10, such that the bonding layer 8 is in intimate contact with the oxide layer 9 of the massive substrate 10. If the layers 8 and 9 are silicon oxide, the bonding can be advantageously obtained by molecular adhesion (or "wafer bonding"), a technique totally familiar to those skilled in the art.

Figure 1C:
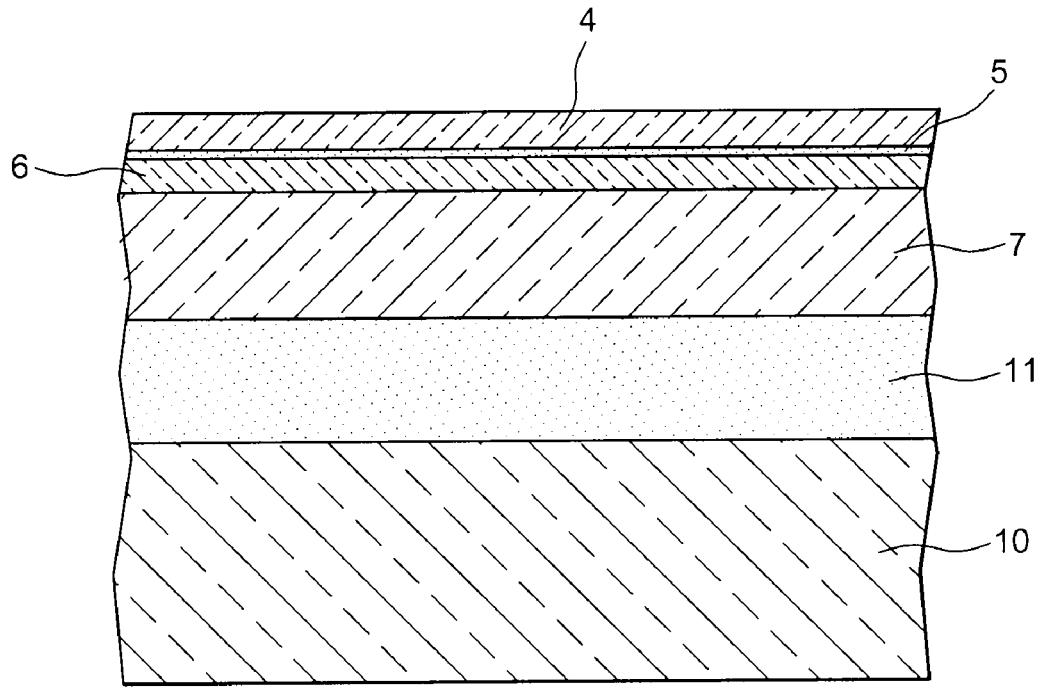

The support 2 and the oxide layer 3 of the SOI substrate 1 are then eliminated, for example by polishing followed by chemical attack or by another technique familiar to those skilled in the art. FIG. 1C represents the structure obtained after turning. On this figure, the oxide layers in intimate contact (referenced 8 and 9 on FIG. 1B) are represented as the shape of a single oxide layer 11. The structure then has an upper silicon layer 4, consisting of a thin layer of the SOI substrate 1.

Figure 1D:
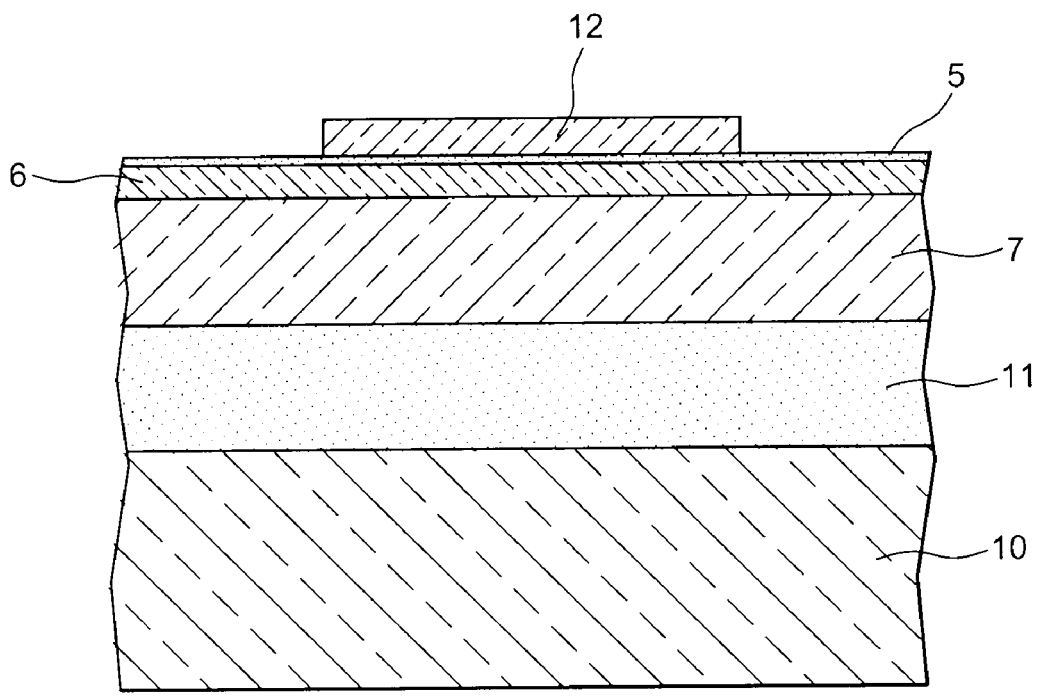

The next step consists of forming the active zones of transistors and other components in the silicon layer 4. In order to simplify matters, the remainder of the description will apply only to the production of a single double grid field effect transistor. The width of the transistor to be produced will be defined by lithography and etching of the silicon layer 4, stopping on the layer 5 of rear grid isolator. FIG. 1D shows an active zone 12 of the transistor produced in this manner.

Figure 1E:
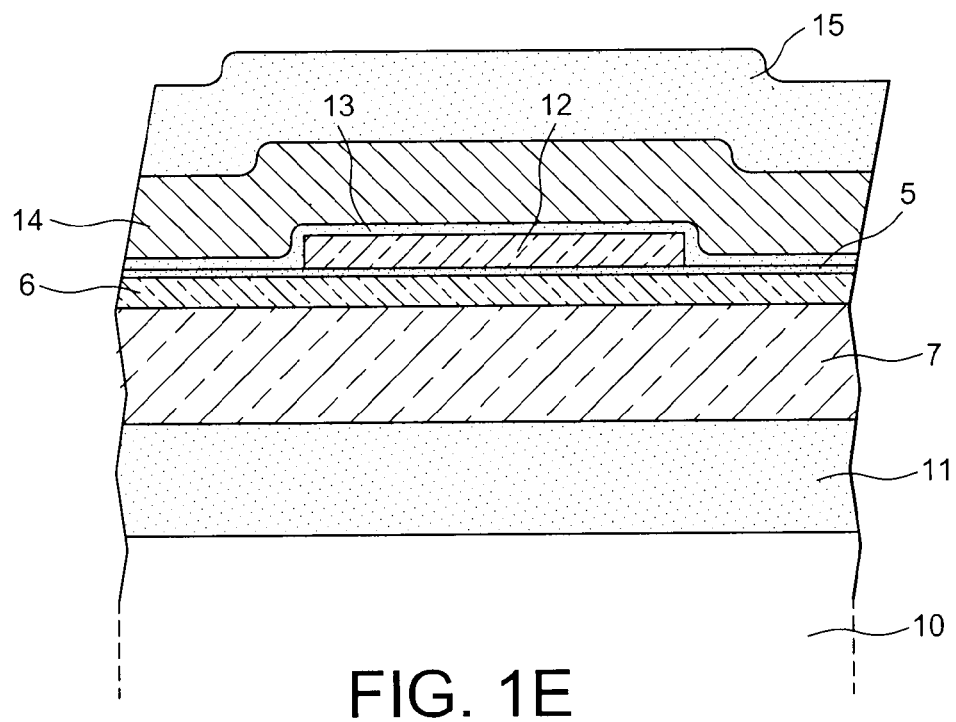

On the structure obtained are then deposited successively, as shown in FIG. 1E, a front grid isolator layer 13 and a hard mask layer 15. The layers 13, 14 and 15 marry with the relief of the structure. The front grid isolator layer 13 can be HfO$_2$, HfSiO$_x$, silicon oxide, nitrided silicon oxide or tantalum oxide. The layer 14 of front grid material can be an alloy of WSi. The hard mask layer 15 can consist of one or more materials (nitride on oxide, polysilicon on oxide, amorphous carbon, nitride alone, etc.). The hard mask defines the length of the front grid, in particular during the isotropic etching. It affords good etching selectivity relative to the front grid material. It is less sensitive to the cleaning necessary before epataxial layering of the source and drain material.

FIGS. 2A to 2J illustrate a first variant following the method for manufacturing a field effect transistor with auto-aligned grids according to the invention. This variant is applied if the front grid and rear grid materials are different or if the etching chemistries are incompatible.

The hard mask and front grid spacers are not necessarily in the same material. The spacers have an electrical role, whereas the hard mask simply protects the front grid during the following etchings: isotropic etching of the front grid, etching of the channel, anisotropic etching of the rear grid, isotropic etching of the rear grid.

Figure 2A:
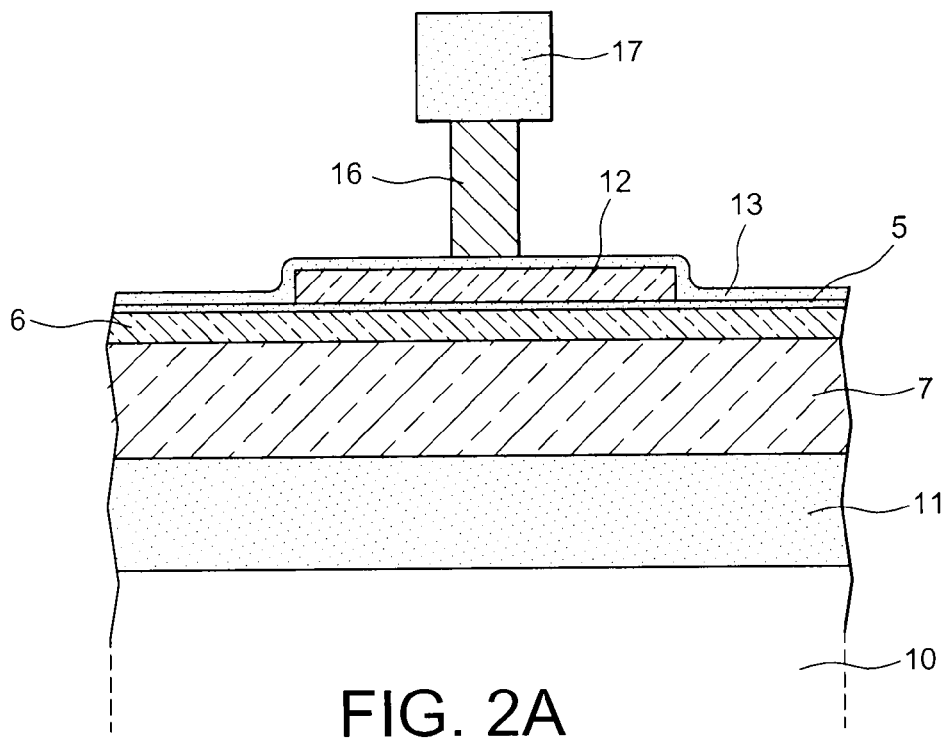
FIGS. 2A to 2J illustrate a first variant following the method for manufacturing a field effect transistor with auto-aligned grids according to the invention.

We now perform the lithography and the etching of the hard mask 15 (see FIG. 1E). The hard mask 15 is etched, stopping on the layer 14 of front grid material. The layer 14 of front grid material is then etched, stopping on the layer 13 of front grid isolator, first with anisotropic etching, then in isotropic etching to reduce the length of the front grid. The structure shown in FIG. 2A is obtained, where the reference 16 represents the front grid of the transistor and the reference 17 represents an existing part of the hard mask.

On the structure thus obtained is deposited a material intended to form the front grid spacers. This layer is in a material less sensitive to the cleaning needed before epitaxial layering, for example silicon nitride. However, spacers and a hard mask in silicon oxide can be considered. These should therefore be sized taking into account the reducing of their dimensions during cleaning and etching operations.

Figure 2B:
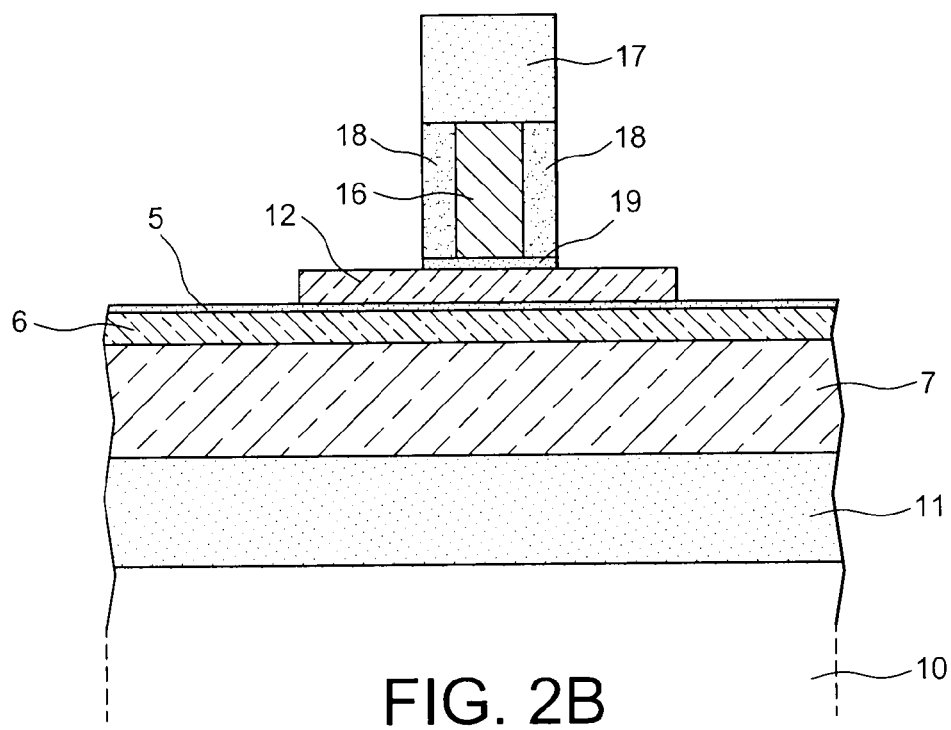
Figure 2C:
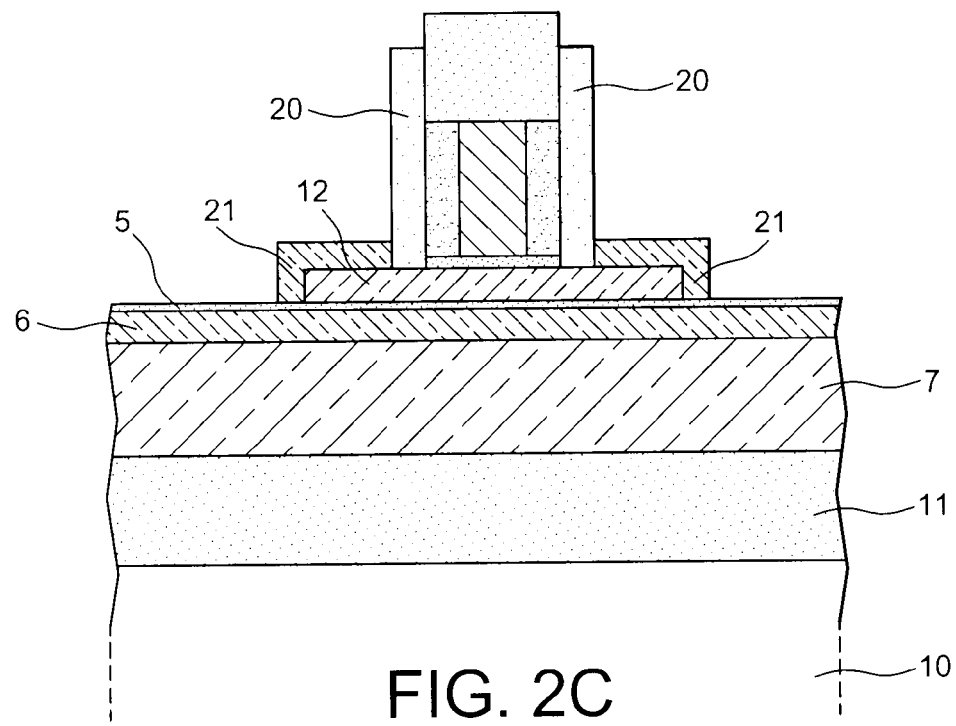

The layer of material for the front grid spacers is etched using an anisotropic etching technique. The layer 13 of front grid isolator is also etched so as to reveal the layer 5 of rear grid isolator and the active zone 12 as shown in FIG. 2B. This figure also shows the spacers 18 for the front grid 16 and the isolator for the front grid 16. Because the front grid 19 is entirely encapsulated after etching of the spacers 18, its material can be different from that for the rear grid.

The second spacers (or sacrificial spacers) are then formed in a material different to that for the first spacers, for example SiO$_2$ in the case where the first spacers are in silicon nitride. These second spacers 20 (see FIG. 2C) are obtained by depositing a layer and anisotropic etching of this layer until only the parts of the layer forming the second spacers are maintained. Because the second spacers are sacrificial, they must be extracted selectively relative to the hard mask, first spacers and the epitaxial layering of the source and drain material. The material for these second spacers can be, in the case of a hard mask and first spacers in silicon oxide, for example in silicon nitride. In one advantageous embodiment, the hard mask and the front grid spacers are in silicon nitride, whereas the sacrificial spacers are in silicon oxide. The sacrificial spacers can be multi-layer (oxide on nitride or even oxide on polysilicon on oxide) in order to produce L-shaped spacers.

The epitaxial regions 21 are then formed from the active zone 12. The epitaxial regions are in SiGe if the active zone 12 is in silicon, in silicon if the active zone is in SiGe or in Ge and in Ge if the active zone is in SiGe or Si. However, it may be considered that this epitaxial material should be in the same material. The result of this is etching of the channel over time with the risk of seeing the source and drain zones damaged.

Figure 2D:
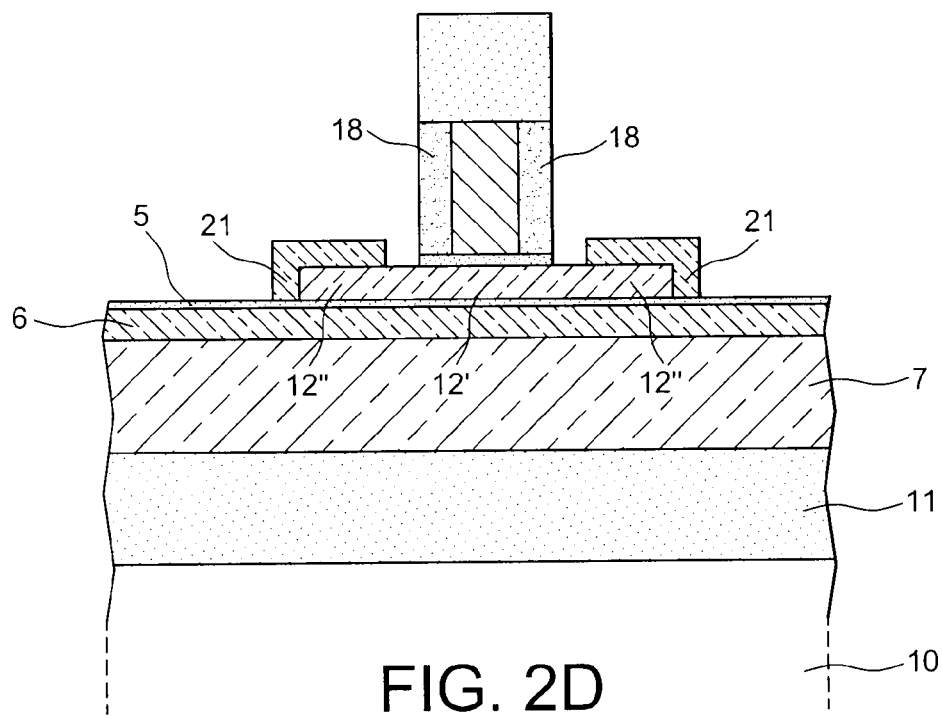

The sacrificial spacers are then eliminated by etching as shown in FIG. 2D, thus exposing the first spacers 18 and the part of the active zone 12 previously covered by the second spacers.

Figure 2E:
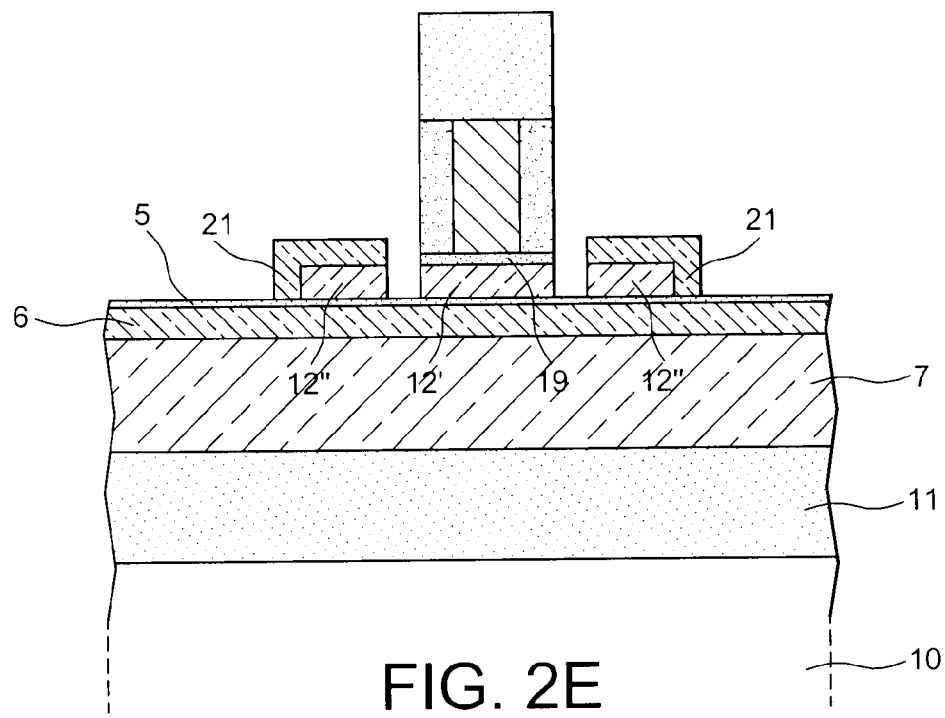

The active zone 12 in silicon is etched selectively relative to the epitaxial regions until the layer 5 of rear grid isolator is revealed, thus delineating the channel 12' of the transistor between the isolator of the front grid 19 and the layer 5 of rear grid isolator (see FIG. 2E). There is also, under the epitaxial regions 21, parts 12" of the active zone. The parts 12", which will provide the source and drain zones, are not polluted by this etching.

Figure 2F:
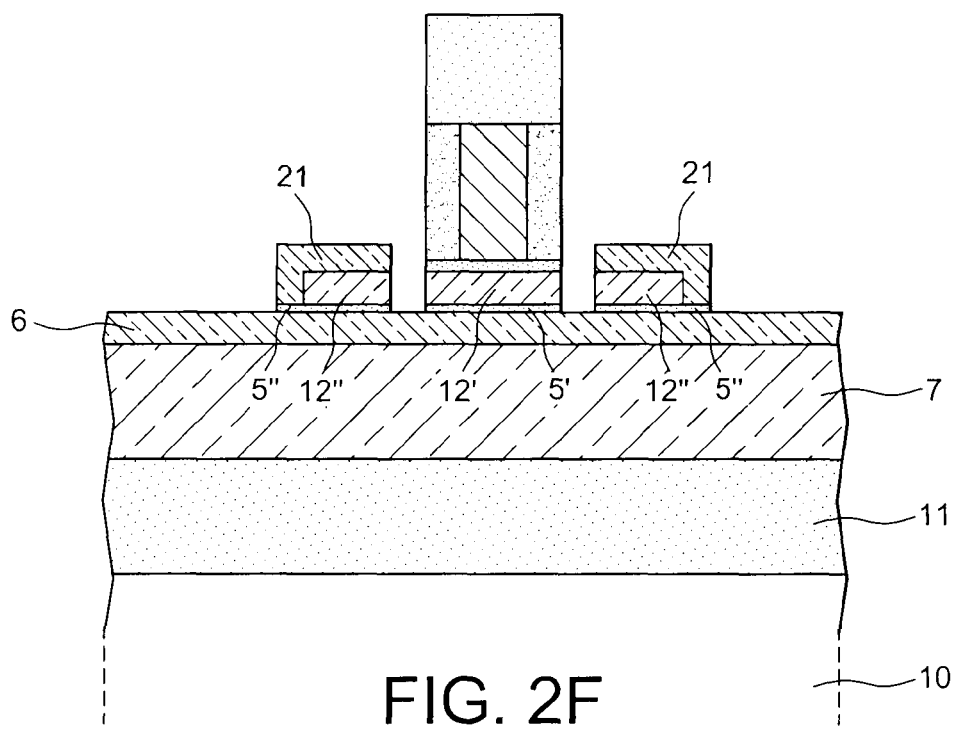
Figure 2G:
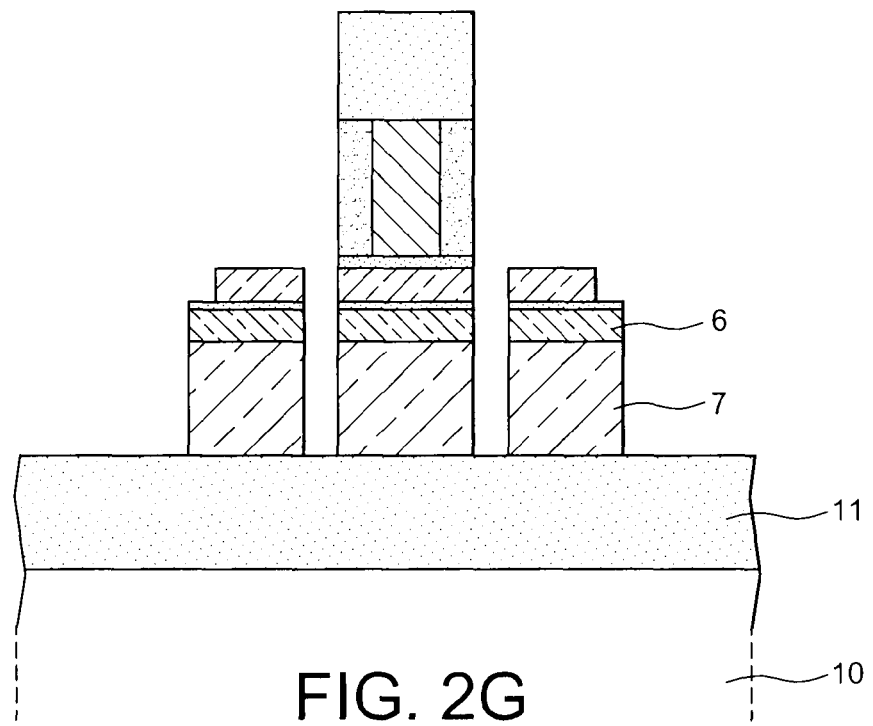
Figure 2H:
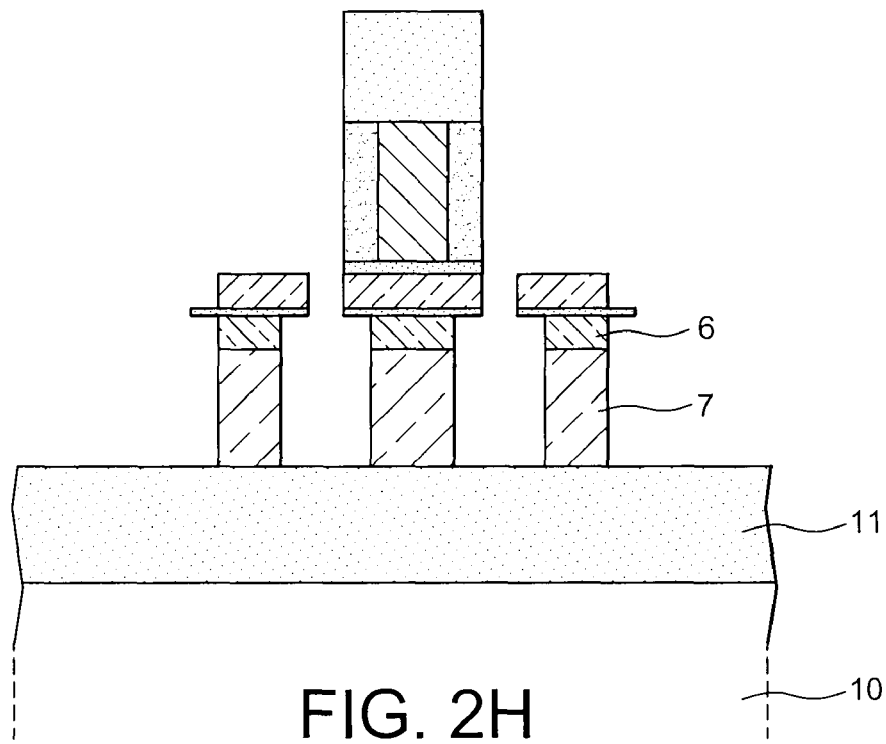
Figure 2I:
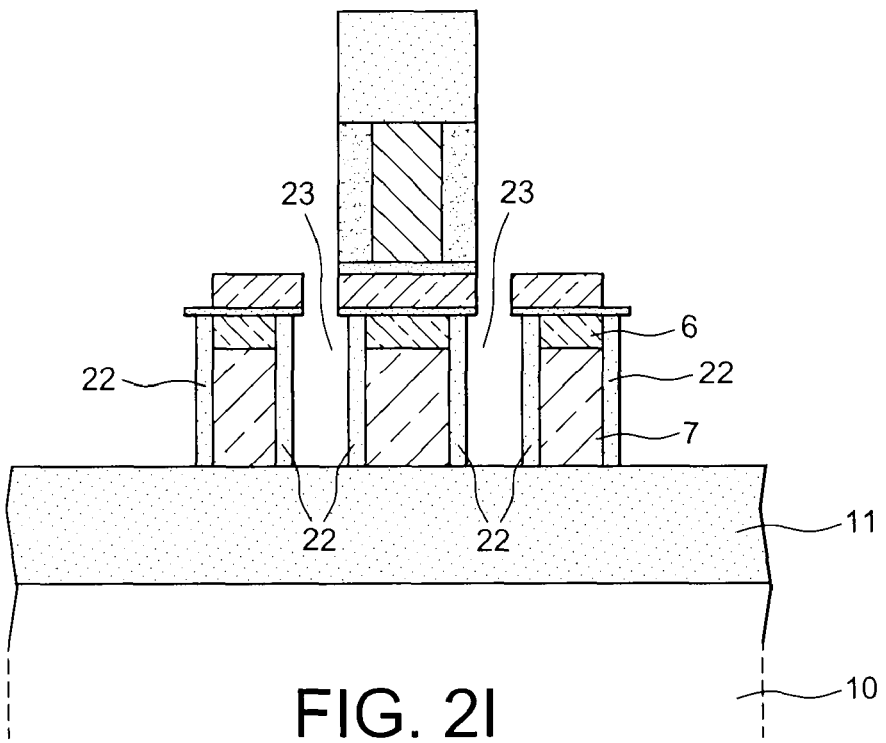

The layer 5 of rear grid isolator is then etched selectively, stopping on the layer 6 of rear grid material (see FIG. 2F). There is then a rear grid isolator 5' under the channel 12' and parts 5" under the source and drain parts 12" and 21.

The next step consists of etching the rear grid. To do this, the first layer 6 of rear grid material and the second layer 7 of rear grid material are etched successively until the oxide layer 11 is revealed. The etching of the layers 6 and 7 is initially anisotropic (see FIG. 2G), then isotropic (see FIG. 2H).

The spacers are then formed on the walls of the rear grid. To do this, a layer of silicon nitride is deposited on the structure obtained previously. This layer of nitride is etched by using an anisotropic etching technique, then an isotropic etching technique to preserve the spacers 22 on the existing parts of the layers 6 and 7 of the rear grid and drain and source support (see FIG. 2I). The sections 23 formed between the rear grid and the source and drain zones can be made good by depositing organic oxide and by creeping of this material.

Figure 2J:
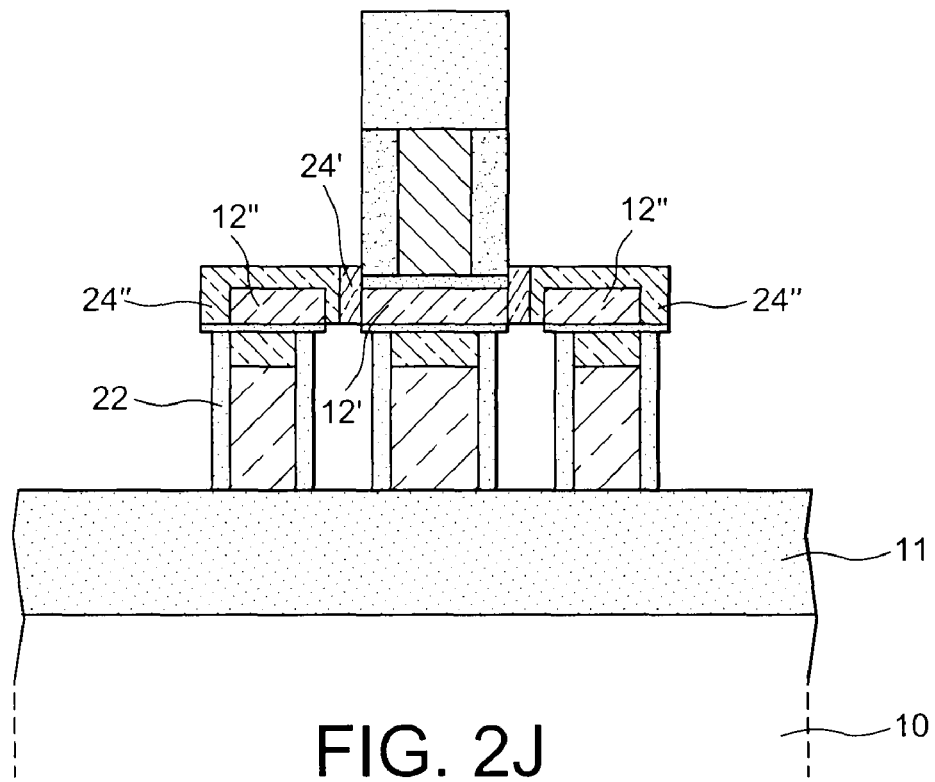

An epitaxial step is then performed to connect the channel 12' to the source and drain regions 12". FIG. 2J shows the epitaxial zone 24' starting from the channel 12' and the epitaxial zones 24" starting from the source and drain parts 12". The epitaxial material can be Si, SiGe or Ge.

Because the end of assembly is standard in CMOS technology, it will not be described.

FIGS. 3A to 3I illustrate a second variant following the method for manufacturing a field effect transistor with auto-aligned grids according to the invention. This variant is applied if the front grid and rear grid materials are identical.

Figure 3A:
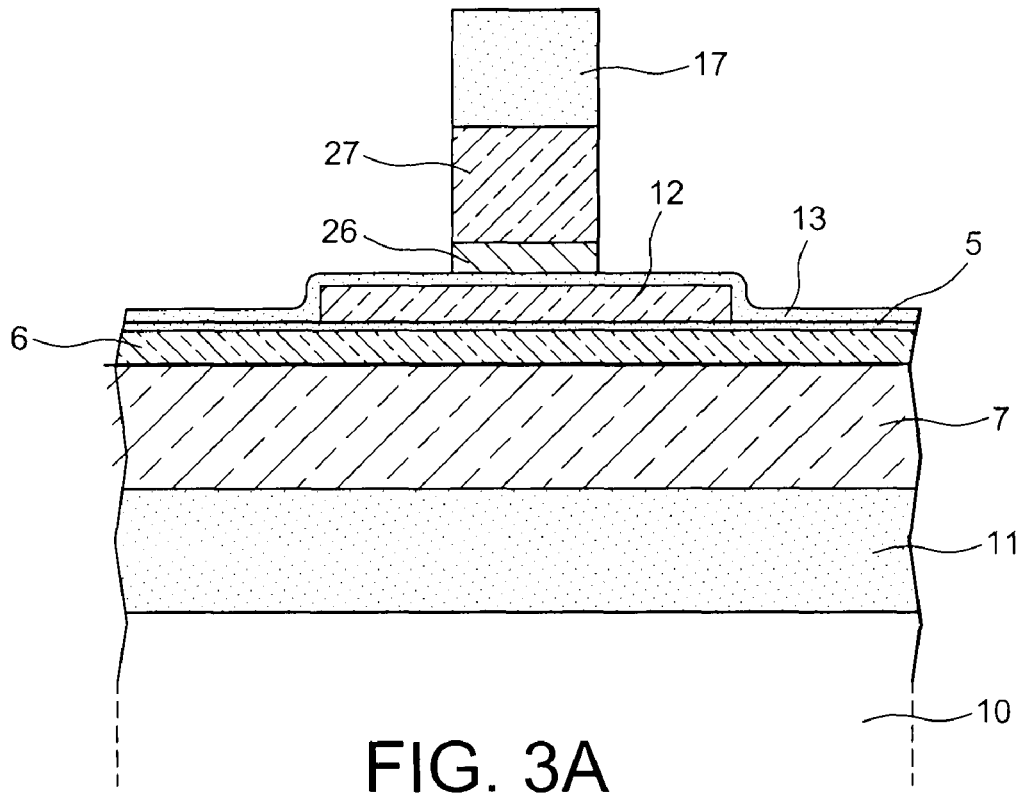
FIGS. 3A to 3I illustrate a second variant following the method for manufacturing a field effect transistor with auto-aligned grids according to the invention.
Figure 3B:
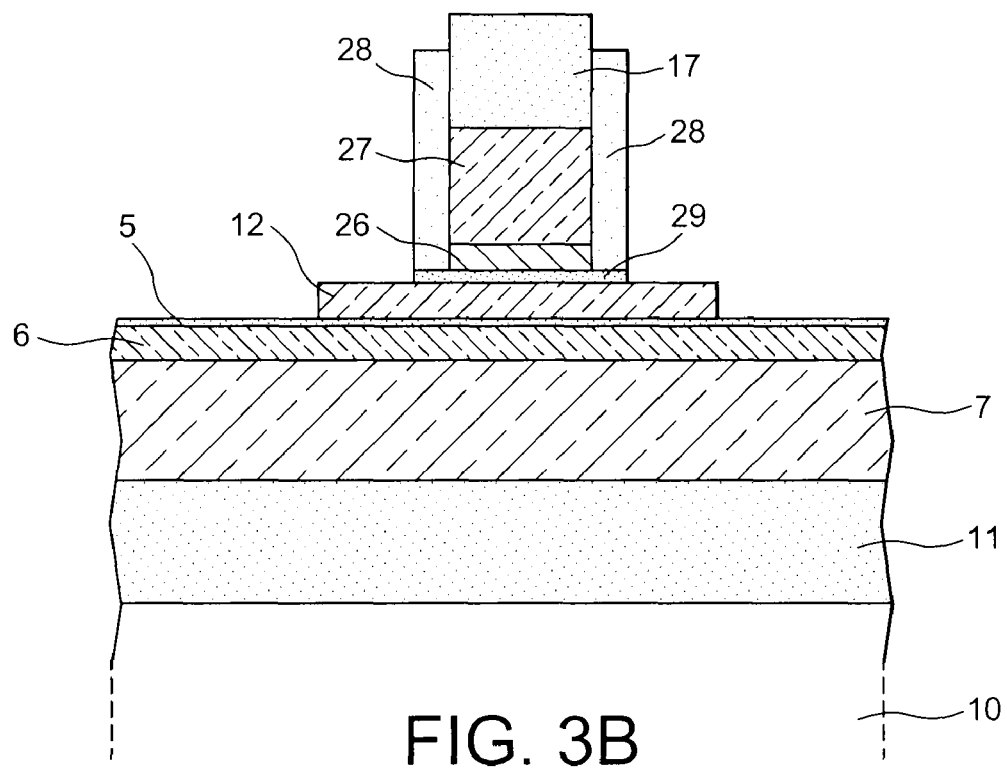
Figure 3C:
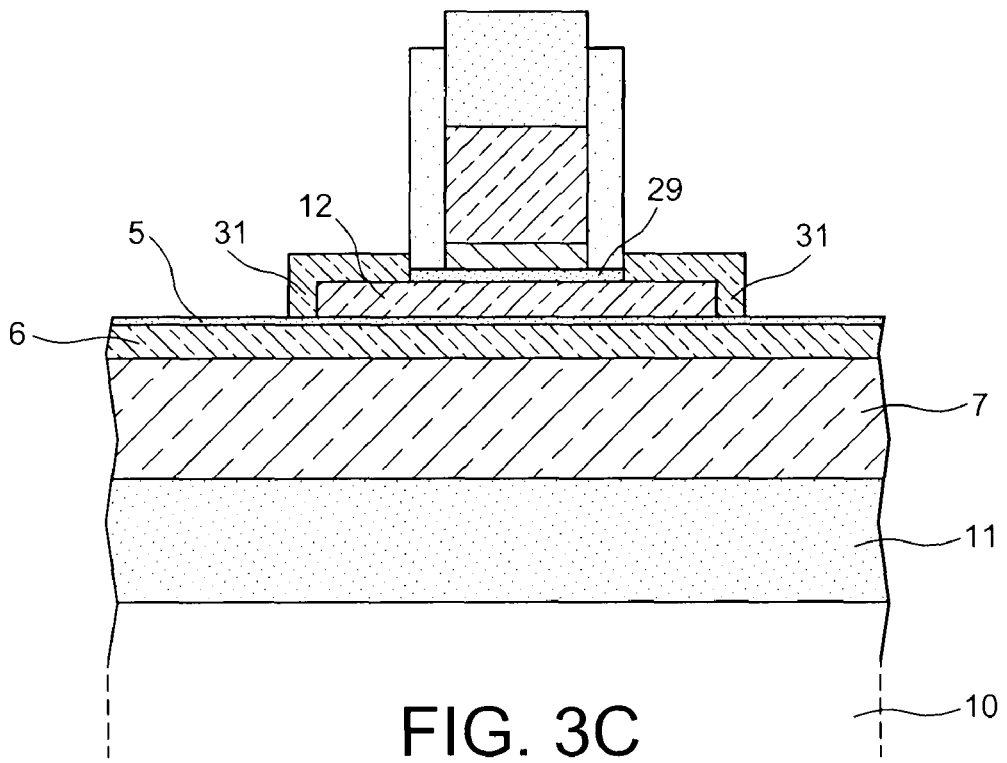

The structure shown in FIG. 3A corresponds to that in FIG. 2A. In these figures, the same references represent the same elements. Unlike the structure of FIG. 2A, the structure of FIG. 3A has front and rear grids in identical materials. Accordingly, the front grid of the transistor comprises a part 26 in a material identical to that of the layer 6 (for example in TiN) and a part 27 in a material identical to that of the layer 7 (for example in SiGe). It will also be noted in FIG. 3A that the front grid 26, 27 has still not, at this stage, been etched isotropically. Indeed, in this variant, it is prudent to perform the isotropic etching of the grids at the same time in order to ensure that they have the same dimensions. The first spacers will be the sacrificial spacers.

On the structure thus obtained is deposited a material intended to form the front grid spacers, for example a layer of silicon oxide. This layer is etched using an anisotropic engraving technique. The isolating layer 13 of the front grid is also etched so as to reveal the isolating layer 5 of the rear grid and the active zone 12 as shown in FIG. 39. This figure also shows the spacers 28 for the front grid 26, 27 and the front grid isolator 29.

Epitaxial regions 31 are then formed (see FIG. 3C) from the active zone 12, for example in SiGe if the active zone 12 is in silicon. The epitaxial regions 31 cover and protect the parts of the active zone 12 which were free from coating before.

Figure 3D:
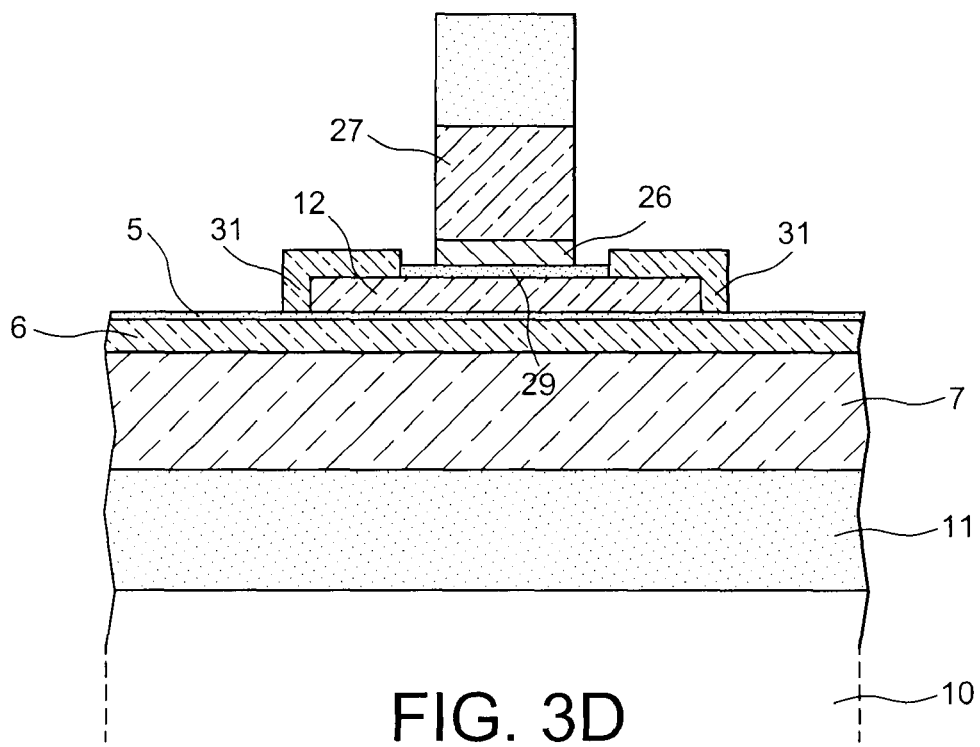

The sacrificial spacers are then extracted until a part of the isolator for the grid 29 is revealed, as shown in FIG. 3D.

A step of etching several materials is then performed. The related parts of the isolator for the grid 29, for example in HfO$_2$, are etched. The front grid isolator 19 and parts of the active zone 12 are then revealed. The active zone 12 is then etched to delineate the channel 12' of the transistor between the front grid isolator 19 and the layer of rear grid isolator. There are also, under the epitaxial regions, parts 12" of the active zone. The parts 12" are not polluted by this etching because they are then covered once more by the epitaxial regions 31.

Etching of the active zone reveals the layer 5 of rear grid isolator, for example in HfO$_2$. The related parts of the layer 5 are then etched. There is then this layer, the rear grid isolator 5' (masked by the channel 12') and parts 5" (masked by the source and drain parts 12" and the epitaxial regions 31).

Figure 3E:
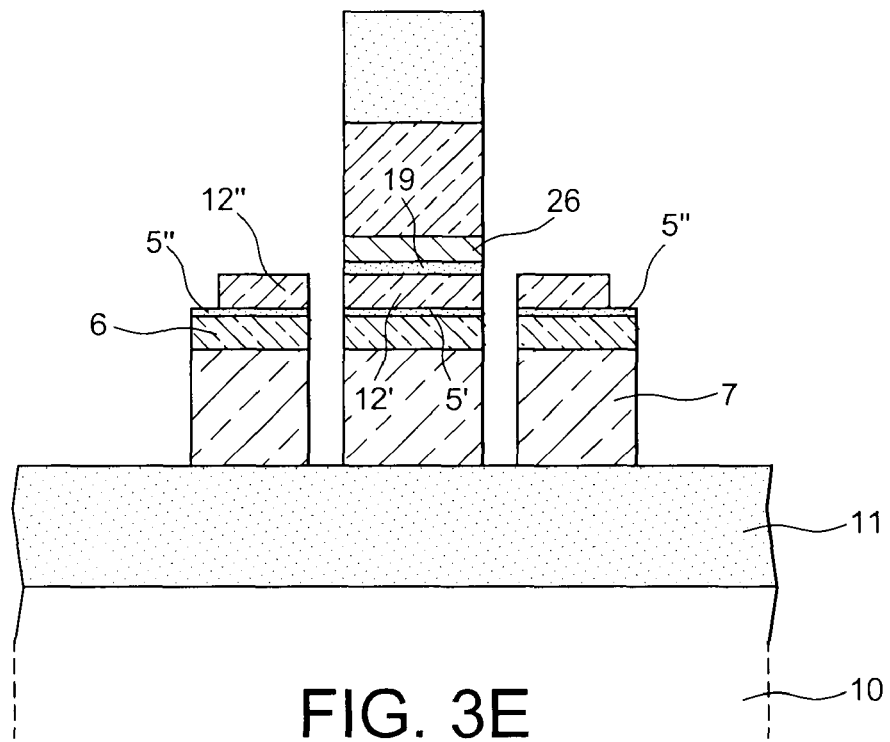

The unmasked parts of the first layer 6 of rear grid material and the unmasked parts of the second layer 7 of rear grid material are then etched anisotropically. The structure obtained is shown in FIG. 3E.

Figure 3F:
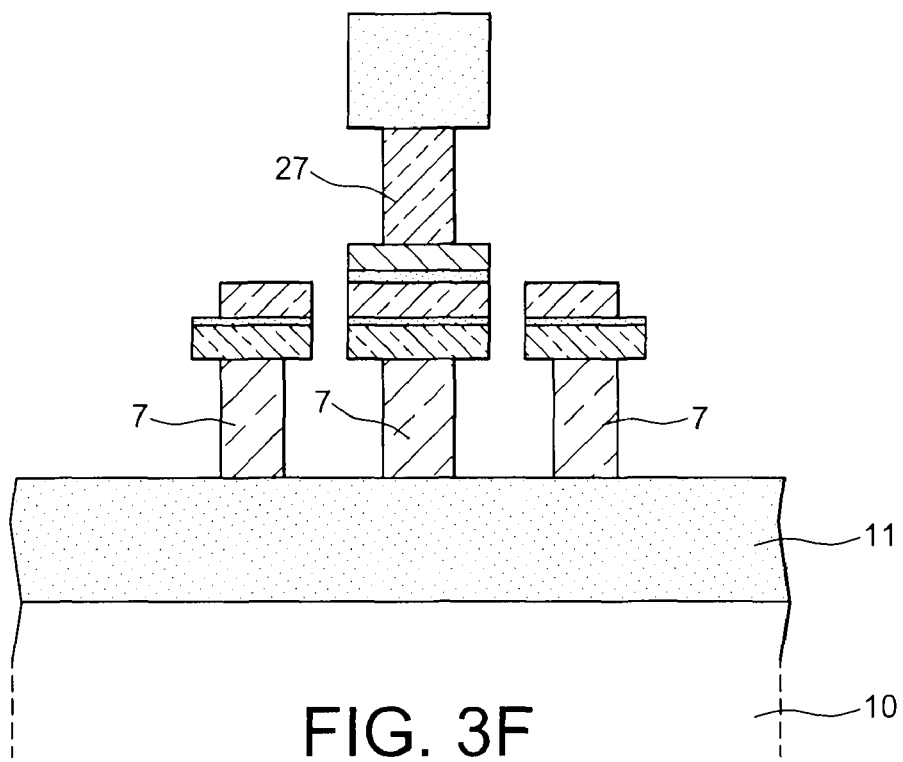
Figure 3G:
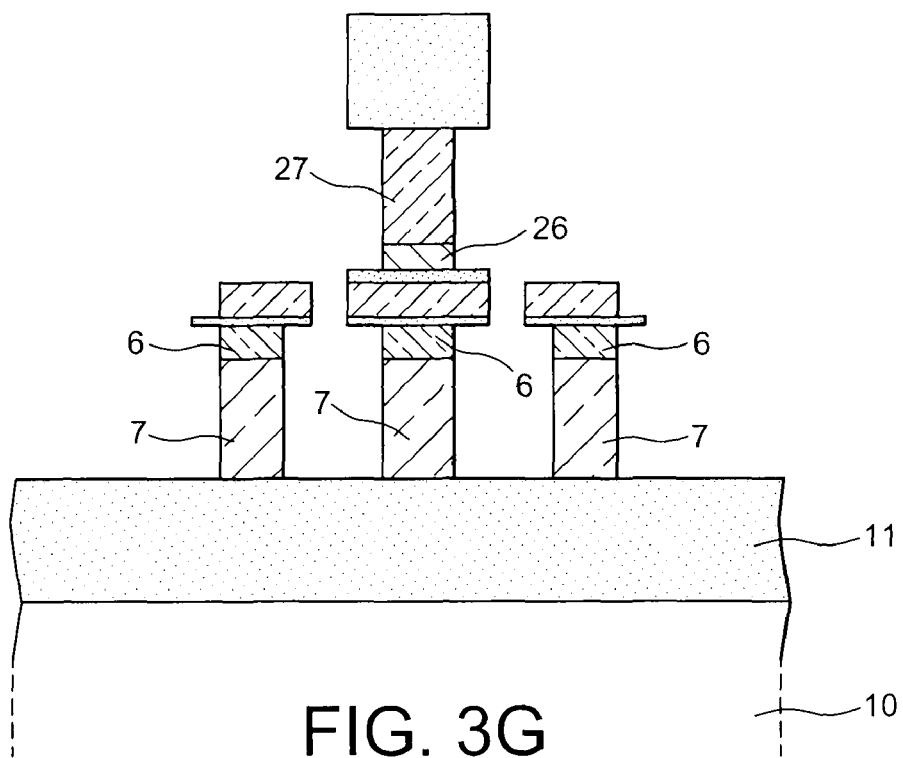
Figure 3H:
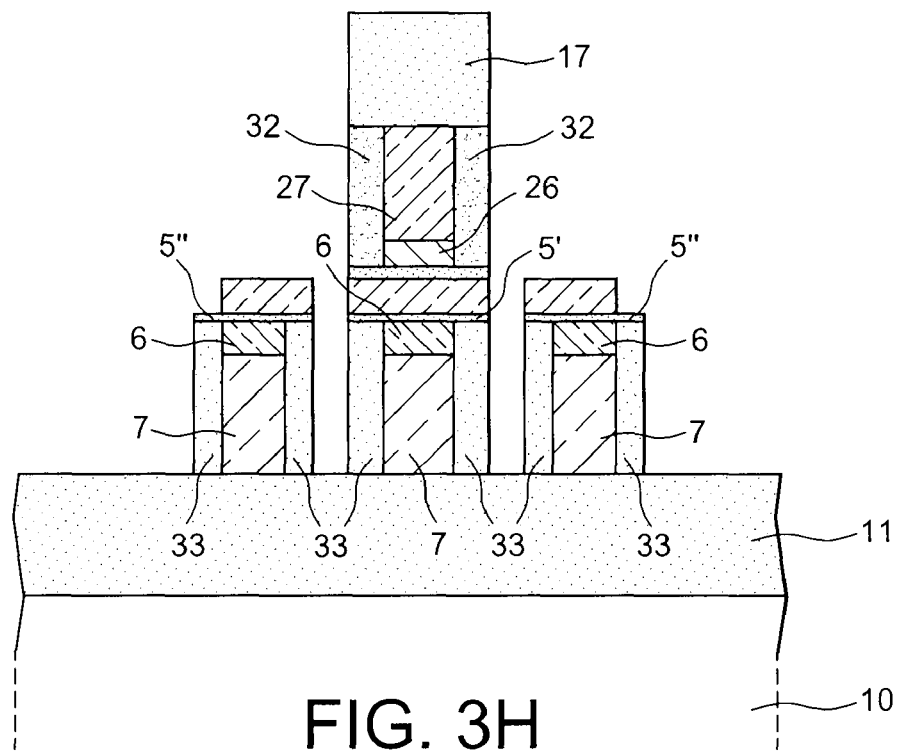

The grids are then etched isotropically. This etching is done in two steps. FIG. 3F shows the structure obtained after etching the elements in identical material, for example in SiGe, consisting of the existing parts of the second layer 7 of rear grid material and the part 27 of the front grid. FIG. 3G shows the structure obtained after etching the elements in identical material, for example in TiN, consisting of the existing parts of the first layer 6 of rear grid material and of the part 26 of the front grid.

The spacers are then formed on the walls of the front and rear grids. To do this, a layer of silicon nitride is deposited on the structure obtained previously. This layer of nitride is etched by using an anisotropic etching technique in order to maintain the spacers at the desired spots (see FIG. 3H). Accordingly, spacers 32 are formed on the walls of the front grid 26, 27 and under the overlap which forms the existing part 17 of the hard mask. Spacers 33 are also formed on the walls of the existing parts of the layers 6 and 7 of rear grid material and under the overlaps which form the rear grid isolator 5' and the parts 5".

Figure 3I:
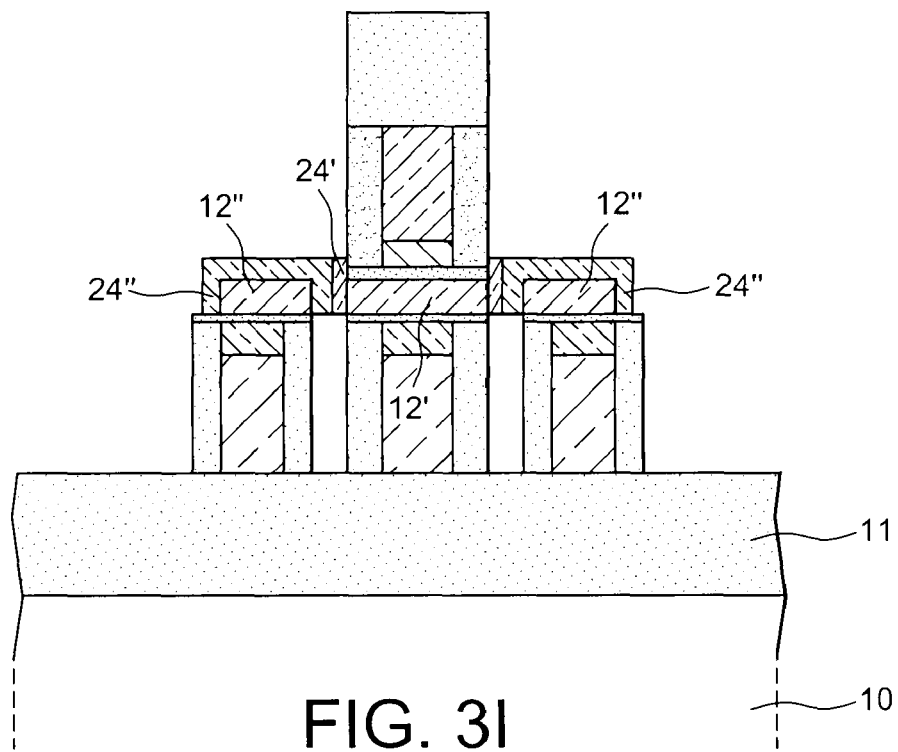

An epitaxial step is then performed to connect the channel 12' to the source and drain regions 12". FIG. 3I shows the epitaxial zone 24' starting from the channel 12' and the epitaxial zones 24" starting from the source and drain parts 12". The epitaxial material can be Si, SiGe or Ge.

The grids are of the type overhanging the isolation zone, which can, with a supplementary level of lithogravure, decouple the grids while producing the electrical contacts. These contacts can be produced by a technique totally familiar to those skilled in the art. The end of assembly is standard in the CMOS technology and will accordingly not be described.

The invention claimed is:

1. A method for manufacturing at least one structure for a double grid field effect transistor, comprising:
    forming, on an isolating face of a first substrate, a stack comprising successively at least one layer of rear grid material, a layer of rear grid isolator, one semi-conducting zone for each structure to be manufactured, an electrically insulating layer of a front grid, at least one layer of front grid material and a masking element for each structure to be manufactured, placed facing the semi-conducting zone;
    forming in the at least one layer of front grid material a pattern reproducing a shape of the masking element and comprising etching of the layer of front grid material to eliminate the front grid material outside said pattern;
    forming on free faces of the pattern a sacrificial spacer covering a first part of the semi-conducting zone;
    eliminating an exposed part of the electrically insulating layer of the front grid, thus revealing a second part of the semi-conducting zone that defines areas for source and drain regions of the transistor;
    forming, after the eliminating the exposed part of the electrically insulating layer of the front grid, a protective layer over the second part of the semi-conducting zone;
    eliminating, after the forming the protective layer, the sacrificial spacer covering said first part of the semi-conducting zone; and
    etching, after eliminating the sacrificial spacer, the first part of the semi-conducting zone, which is no longer covered by the sacrificial spacer, to delineate a channel of the transistor.

2. The method according to claim 1, in which the step of forming the stack comprises:
    choosing a second substrate comprising a support supporting successively another electrically insulating layer and a semi-conducting layer;
    forming, on said semi-conducting layer, said electrically insulating layer of the rear grid and said at least one layer of rear grid material;
    affixing the second substrate on the first substrate, said support, said another electrically insulating layer, and said semi-conducting layer formed on the second substrate facing an electrically insulating face of the first substrate;
    eliminating the support and the electrically insulating layer of the second substrate to reveal the semi-conducting layer;
    etching the semi-conducting layer to obtain said semi-conducting zone and reveal the electrically insulating layer of the rear grid;
    forming successively on said semi-conducting zone and the electrically insulating layer of the rear grid revealed with the eliminating the exposed part of the electrically insulating layer of the front grid, at least one layer of front grid and a masking layer; and
    etching the masking layer to obtain said masking element.

3. The method according to claim 2, further comprising:
    forming the another electrically insulating layer on said at least one layer of rear grid material, which acts as a bonding layer, at a time of the affixing the second substrate on the first substrate, with an electrically insulating face of the first substrate which is a free face of the electrically insulating layer for the first substrate and also forming a bonding layer.

4. The method according to any one of claims 1 to 3, in which the forming the pattern in the layer of front grid material comprises:
    applying anisotropic etching step that eliminates the front grid material outside the pattern,
    applying an isotropic etching step that reduces a length of the front grid,
    forming housings for front grid spacers under the masking element, and
    forming the front grid spacers in said housings.

5. The method according to claim 4, in which the front grid spacers are formed by depositing a layer of front grid spacer material and by anisotropic etching of the front grid spacer material.

6. The method according to claim 4, further comprising:
etching the electrical insulating layer of the rear grid exposed after etching the first part of the semi-conducting zone;
eliminating said protective layer;
etching said at least one layer of rear grid material not masked by unetched parts of the electrical insulating layer for the rear grid, until said isolating face of the first substrate is reached;
reducing, by isotropic etching, a length of existing parts of said at least one layer of rear grid material, and forming housings for rear grid spacers,
forming the rear grid spacers in said housings; and
epitaxial layering, starting with the second part, of the semi-conducting zone, of zones for connection to the channel of the transistor so as to constitute the source and drain regions.

7. The method according to any one of claims 1 to 3, in which the forming the pattern in the layer of the front grid material comprises an anisotropic etching to eliminate the front grid material outside the pattern.

8. The method according to claim 7, further comprising:
etching the electrical insulating layer of the rear grid exposed after etching the first part of the semi-conducting zone;
eliminating said protective layer;
etching said at least one layer of rear grid material not masked by unetched parts of the electrical insulating layer for the rear grid, until said isolating face of the first substrate is reached;
reducing, by isotropic etching, a length of existing parts of said at least one layer of front grid material and said at least one layer of rear grid material, and forming housings for front grid spacers and housings for rear grid spacers;
forming the front grid spacers in the housings for the front grid spacers and the rear grid spacers in the housings for the rear grid spacers; and
epitaxial layering, starting with the second part, of the semi-conducting zone, of zones for connection to the channel of the transistor so as to constitute the source and drain regions.

* * * * *